US010770686B2

(12) United States Patent
Benzie et al.

(10) Patent No.: US 10,770,686 B2
(45) Date of Patent: Sep. 8, 2020

(54) ORGANIC LIGHT EMITTING DEVICE WHICH EMITS WHITE LIGHT

(71) Applicant: Cambridge Display Technology Limited, Cambridgeshire (GB)

(72) Inventors: Philip Benzie, Huntingdon (GB); Colin Baker, Cambridge (GB); Adam Strevens, Cambridge (GB); William Young, Cambridge (GB)

(73) Assignee: Cambridge Display Technology Limited, Godmanchester (GB)

( * ) Notice: Subject to any disclaimer, the term of this patent is extended or adjusted under 35 U.S.C. 154(b) by 200 days.

(21) Appl. No.: 15/762,245

(22) PCT Filed: Aug. 11, 2016

(86) PCT No.: PCT/GB2016/052496
§ 371 (c)(1),
(2) Date: Mar. 22, 2018

(87) PCT Pub. No.: WO2017/051147
PCT Pub. Date: Mar. 30, 2017

(65) Prior Publication Data
US 2018/0301662 A1    Oct. 18, 2018

(30) Foreign Application Priority Data
Sep. 22, 2015 (GB) .................................. 1516761.2

(51) Int. Cl.
*H01L 51/52* (2006.01)
*H01L 51/50* (2006.01)

(52) U.S. Cl.
CPC ........ *H01L 51/5265* (2013.01); *H01L 51/504* (2013.01); *H01L 51/5218* (2013.01); *H01L 51/5234* (2013.01); *H01L 2251/5315* (2013.01)

(58) Field of Classification Search
CPC ............. H01L 51/5265; H01L 51/5218; H01L 51/504; H01L 51/5234; H01L 51/5271;
(Continued)

(56) References Cited

U.S. PATENT DOCUMENTS 6,211,613 B1 * 4/2001 May ..................... H01L 27/32
                                                   313/504
8,921,842 B2 * 12/2014 Park ................... H01L 27/3209
                                                   257/40
(Continued)

FOREIGN PATENT DOCUMENTS

CN      1497306 A   *  9/2003   ............. H05B 33/14
CN    104269431 A       1/2015
(Continued)

OTHER PUBLICATIONS

International Search Report and Written Opinion for International Application No. PCT/GB2016/052496, dated Nov. 10, 2016.
(Continued)

*Primary Examiner* — Khiem D Nguyen
(74) *Attorney, Agent, or Firm* — Wolf, Greenfield & Sacks, P.C.

(57) ABSTRACT

An organic light emitting device which emits white light in use, comprising a reflective anode (3), a first light emitting layer (9) which emits red light located over said anode, a second light emitting layer (11) which emits blue light and green light located over said first light emitting layer, and a cathode structure located over said second light emitting layer comprising a first semi-reflecting layer (15) and a second semi-reflecting layer (21) with a layer (19) of light transmissive material between the first and second semi-reflecting semi-transparent layers, the distance between the reflective anode (3) and the first semi-reflecting semi-transparent layer (17) being selected to form a micro-cavity which enhances blue light emission and red light emission
(Continued)

from the device, and the distance between the reflective anode (3) and the second semi-reflecting semi-transparent layer (21) being selected to enhance green light emission from the device.

7 Claims, 3 Drawing Sheets

(58) Field of Classification Search
CPC ............ H01L 51/5203; H01L 51/5206; H01L 51/5221; H01L 51/5072; H01L 51/5324; H01L 51/5256; H01L 27/3211; H01L 27/3206; H01L 27/3213
See application file for complete search history.

(56) References Cited

U.S. PATENT DOCUMENTS

| | | | |
|---|---|---|---|
| 9,099,666 B2 | 8/2015 | King et al. | |
| 2006/0105198 A1 | 5/2006 | Spindler et al. | |
| 2009/0115319 A1 | 5/2009 | Kim et al. | |
| 2011/0042696 A1* | 2/2011 | Smith | H01L 51/5265 257/89 |
| 2011/0315970 A1* | 12/2011 | Yokoyama | H01L 27/3211 257/40 |
| 2014/0167016 A1* | 6/2014 | Yoo | H01L 51/5028 257/40 |
| 2014/0353635 A1 | 12/2014 | Chou et al. | |
| 2016/0155976 A1* | 6/2016 | Kim | H01L 51/5044 257/40 |
| 2016/0254330 A1 | 9/2016 | Uchida et al. | |
| 2016/0260781 A1 | 9/2016 | Yang et al. | |
| 2016/0359143 A1* | 12/2016 | Osawa | H01L 51/5278 |

FOREIGN PATENT DOCUMENTS

| | | |
|---|---|---|
| GB | 2351840 A | 1/2001 |
| JP | 2008-503871 A | 2/2008 |
| JP | 2008-251542 A | 10/2008 |
| JP | 2011-210678 A | 10/2011 |
| WO | WO 2006/013373 A2 | 2/2006 |
| WO | WO 2015/064491 A1 | 5/2015 |

OTHER PUBLICATIONS

Search Report for British Application No. 1516761.2, dated Mar. 17, 2016.
Examination Report for British Application No. 1516761.2, dated Oct. 16, 2017.
Burrows et al., Achieving full-color organic light-emitting devices for lightweight, flat-panel displays. IEEE Transactions on Electron Devices. 1997;44(8):1188-1203.
Burrows et al., Control of microcavity effects in full color stacked organic light emitting devices. Applied Physics Letters. 1998;73(4):435-7.
Hou et al., Realization of blue, green, and red emission from top-emitting white organic light-emitting diodes with exterior tunable optical films. Organic Electronics. Jul. 8, 2008;9(6):959-63.
PCT/GB2016/052496, dated Nov. 10, 2016, International Search Report and Written Opinion.
GB1516761.2, dated Mar. 17, 2016, Search Report.
GB1516761.2, dated Oct. 16, 2017, Examination Report.
Japanese communication in connection with Japanese Application No. 2018-514831, dated May 29, 2020.

* cited by examiner

ORGANIC LIGHT EMITTING DEVICE WHICH EMITS WHITE LIGHT

RELATED APPLICATIONS

This application is a national stage filing under 35 U.S.C. § 371 of international PCT application, PCT/GB2016/052496, filed Aug. 11, 2016, which claims priority to United Kingdom patent application, GB 1516761.2, filed Sep. 22, 2015, each of which is incorporated herein by reference in its entirety.

FIELD OF THE INVENTION

The present invention relates to an organic light emitting device which emits white light in use. It relates particularly, though not exclusively, to a top-emission device having red, green and blue light emitting materials.

BACKGROUND

US2011/0069732, describes the use of a Distributed Bragg Reflector (DBR) using two DBR stacks with a spacer, for an OLED structure.

SUMMARY OF INVENTION

The present invention provides an organic light emitting device which emits white light in use, comprising a reflective anode, a first light emitting layer which emits red light located over said anode, a second light emitting layer which emits blue light and green light located over said first light emitting layer, and a cathode structure located over said second light emitting layer comprising a first semi-reflecting semi-transparent layer and a second semi-reflecting semi-transparent layer with a layer of light transmissive material between the first and second semi-reflecting semi-transparent layers, the distance between the reflective anode and the first semi-reflecting semi-transparent layer being selected to form a micro-cavity which enhances blue light emission and red light emission from the device, and the distance between the reflective anode and the second semi-reflecting semi-transparent layer being selected to enhance green light emission from the device.

The device includes a novel cathode structure fabricated using a double-layered thin reflective cathode (i.e. double mirror cathode) that can be used in a top emission device to enhance overall efficiency with respect to a bottom emitting standard ITO device even in the absence of an out-coupling film. This is done by creating a pair of co-located micro-cavities sensitive to all three different coloured emitters. Furthermore, utilisation of microcavities narrows the normal angular spectral emission, so that more light is within the escape cone of the device than would be the case for a standard non-microcavity device. With the novel structure, a second u-cavity is formed with the second cathode mirror to emphasise the green component (within a dielectric/metal hybrid reflector).

Figure 1:
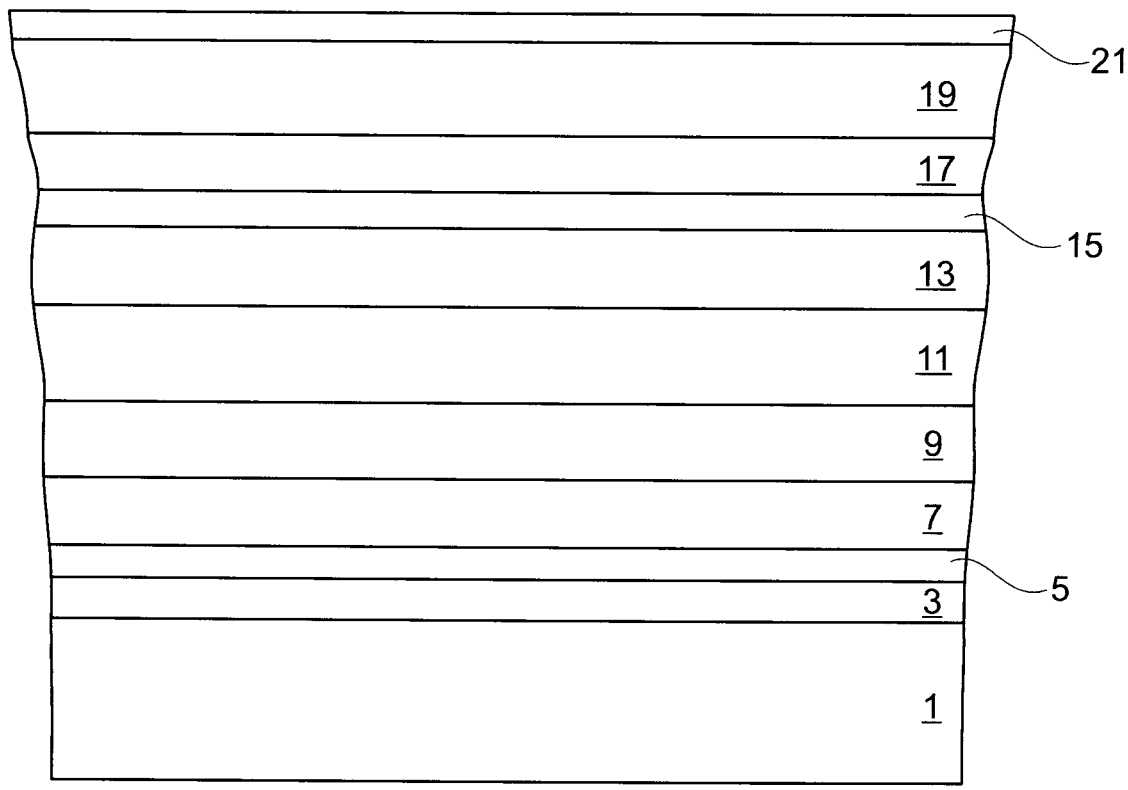
FIG. 1 is a schematic of a top emission device according to the present invention.

A device according to the invention is shown schematically in cross-section in FIG. 1, and was fabricated as described below.

On a glass substrate (1), a reflective film of AlNiLi (3) 150 nm in thickness was evaporated, followed by evaporating a layer of indium tin oxide 7 nm in thickness (5) without breaking vacuum. Onto this layer, a 120 nm thick layer of an organic hole injection layer (7) was deposited by spin coating from solution. Onto this layer, a layer of hole transporting material (9) (also known as an interlayer) 50 nm thick was deposited by spin coating. This layer included a red light emitting material. Onto this layer, a light emitting layer (11) 65 nm thick was deposited by spin coating. This light emitting layer included blue and green light emitting materials. Onto this light emitting layer a further layer (13) comprising an electron transporting material 100 nm thick was deposited, again by spin coating from solution. Onto this electron transporting layer (ETL) a 17 nm thick layer of silver (15) was deposited by thermal evaporation. Onto this silver layer, a 20 nm thick buffer layer (17) was deposited, followed by a 100 nm thick layer of silicon dioxide (19) and finally a further 17 nm thick silver layer (21). Layers 15 and 17 are semi-reflecting and semi-transparent for visible light (i.e. light in the wavelength range 400 nm to 700 nm). The buffer layer 17 and the silicon dioxide layer 19 are both light transmissive for visible light.

The red+blue resonant micro-cavity is formed between the AlNiLa and first silvered mirror, 'Ag1' (layer 17). The thicknesses are chosen to have peak emission at ~450 nm and ~620 nm. The second mirror, 'Ag2' (layer 21), is selected to form a resonant micro-cavity enhancing green emission. The actual optimal distances between the reflective and semi-reflecting layers will depend upon the optical path lengths (i.e. thickness and refractive index) and the exact emission wavelengths of the light emitting materials being used in the intervening layers.

Figure 2:
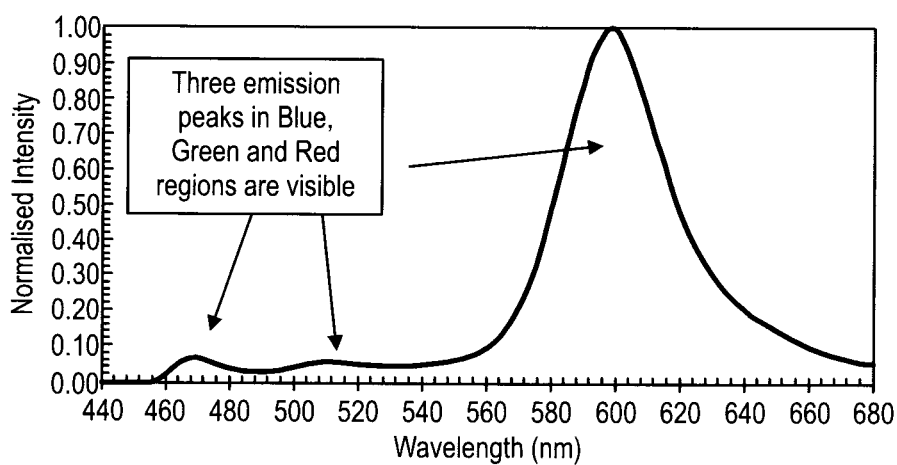
FIG. 2 illustrates the experimental electroluminescence emission spectrum from the device of FIG. 1.
Figure 3:
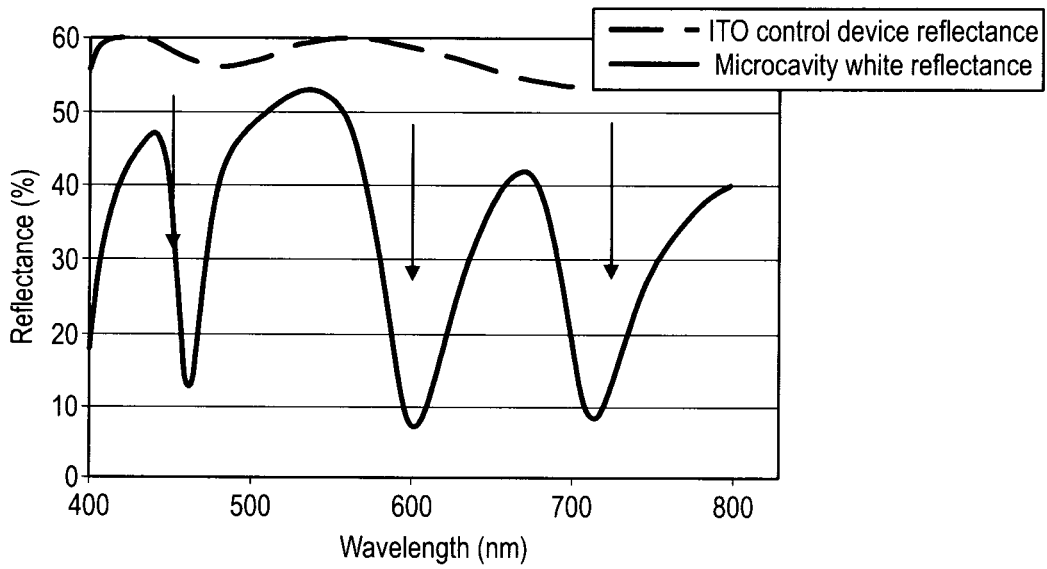
FIG. 3 shows the experimental reflectance spectrum for the same device and a control device.

The above structure has not been optimised, and was used as a proof of concept. From the experimental data in FIGS. 2 and 3, the emission can clearly be seen to be operating on three cavity modes, and there is room for tuning of the colour points and CRI/CCT by adjusting the thickness of the SiO2 layer (19) for the green.

To illustrate what might be achieved by careful choice of film optical properties and film thicknesses, the structure was modelled using a computer. The modelled device structure is shown schematically in FIG. 4.

To calculate and optimise the reflectance optical properties of the device, a transfer matrix approach was used to model the passive optical behaviour. This required the specification of layer thicknesses, refractive index and extinction properties of all layers within the device and was done with standard commercial optical software. A Woollam ellipsometer was used to determine the refractive index properties of unknown layers within the stack. The unpolarised reflectance of the device stack at normal incidence can be used a simple metric for both experimental and theoretical understanding of the cavity modes. When the microcavity is tuned for on-axis emission at a particular wavelength, a minima will appear in the reflectance characteristics of the device. Assuming, one of the mirrors is fully reflective (for example the cathode), the linewidth of this reflectance minima is dependent on the reflectance of the semi-transparent mirror and the length of the effective length optical cavity (i.e. the optical distance between semi-transparent reflector). Effectively the cavity can be considered to act like a Fabry-Perot interferometer (as explained in S. Hoffman et al., 2011, Optics Express, Vol 19 (No. S6)). Here F is the Finesse, which is dependent on the relative reflectivities of the mirrors, and transmission is dependent on the phase, delta, $$T(\lambda)=1/[1+F \sin^{\wedge}(delta/2)] \quad (1)$$

$$Delta=4*pi(n\_eff*d/lambda) \quad (2)$$

According to equation (1), it can easily be shown that for an effective refractive index of 1.6 (typical for organic layers), when d the thickness is approx. 350 nm, the cavity will be resonant at both blue and red wavelengths. Hence, if now, placing an emitter in the cavity, the micro-cavity can be tuned to emphasise the on-axis emission at the chosen wavelengths. Since the first thin-silver mirror is semi-transparent, it is further, possible to include a second mirror or reflector after the first, and now tuning the thickness of the dielectric spacer before this mirror, such that the effective optical thickness between the second semi-transparent mirror and full reflective mirror emphasises the green component.

In practise, this can be simulated accounting for the full-behaviour of the dispersive characteristics of the device layers and accurately modelled. Subsequently, in order to model the emissive behaviour it is necessary to include the emissive properties of a dipole within the stack. A commercial optics package (Setfos) was used to model the on-axis behaviour, taking into account the fluorescent and phosphorescent emission of three emitters required for white emission. Under some basic assumptions (see table 1) about the emitter position and emission profile (15 nm exponential RZ decaying away from IL for the blue and green components, Red RZ near IL) the cd/A efficiency was then determined for the device stack demonstrating a reasonable cd/A efficiency, which due to the nature of the micro-cavity should emphasise the forward emission.

Figure 4:
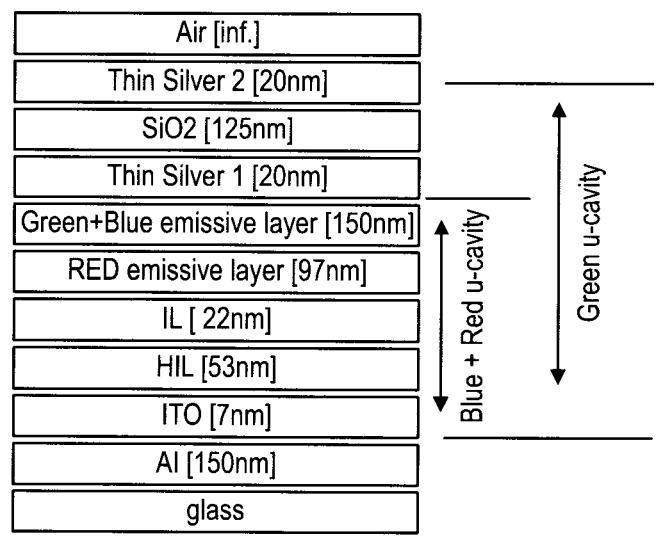
FIG. 4 is a schematic of a computer modelled device.
Figure 5:
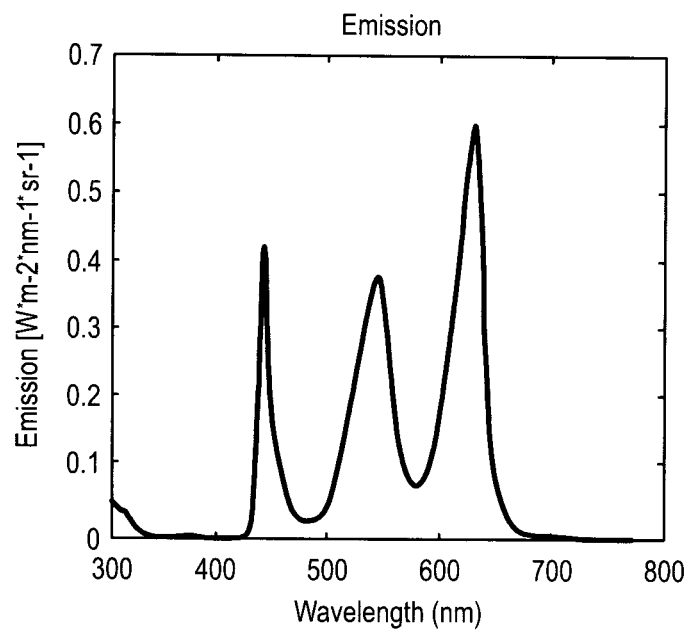
FIG. 5 illustrates the electroluminescence emission spectrum from the computer modelled device of FIG. 4.
Figure 6:
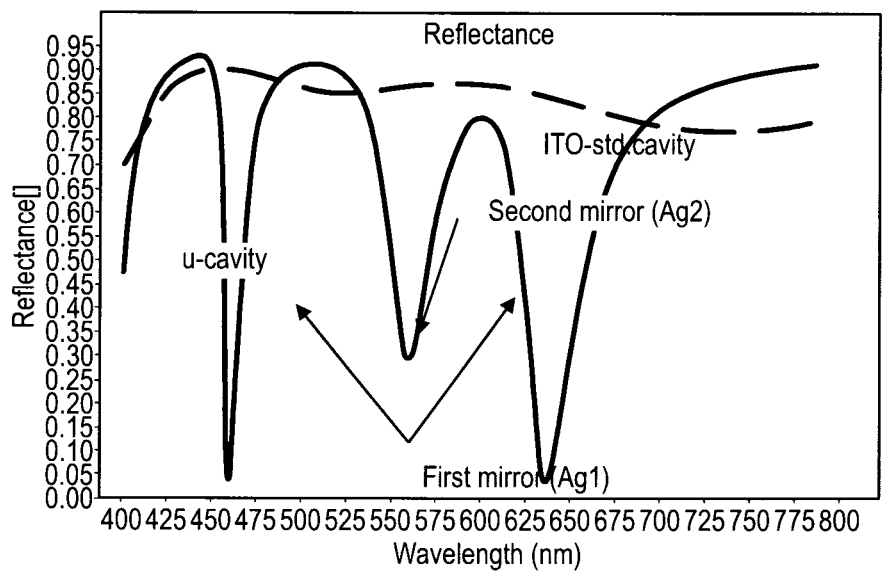
FIG. 6 shows the reflectance spectrum for the same computer modelled device.

FIG. 5 shows the electroluminescence emission spectrum from the computer modelled device of FIG. 4. FIG. 6 shows the reflectance spectrum for the same computer modelled device.

TABLE 1

|  | Emissive layer | | |
| --- | --- | --- | --- |
|  | Blue emitter in Green + Blue layer | Red emitter in Red doped IL | Green emitter in Green + Blue layer |
| IQE % | 100 | 100 | 100 |
| Dipole orientation | parallel | isotropic | Isotropic |

Preferably, the organic light emitting device is adapted such that the reflective anode is carried by a substrate, and the light is emitted out of the device through the cathode structure in use.

Preferably, the distance between the reflective anode and the first semi-reflecting semi-transparent layer is selected to be in the range 330 to 370 nm, very preferably in the range 345 to 355 nm.

The refractive index of the light emitting layers is preferably in the range 1.55 to 1.67.

The invention claimed is:

1. An organic light emitting device which emits white light, comprising:
    a reflective anode,
    a first light emitting layer which emits red light located over said reflective anode,
    a second light emitting layer which emits blue light and green light located over said first light emitting layer, and
    a cathode structure located over said second light emitting layer comprising:
        a first semi-reflecting semi-transparent layer; and
        a second semi-reflecting semi-transparent layer with a layer of light transmissive material between the first and second semi-reflecting semi-transparent layers,
        wherein a first distance between the reflective anode and the first semi-reflecting semi-transparent layer is selected to form a first micro-cavity which enhances blue light emission and red light emission from the organic light emitting device, and
        wherein a second distance between the reflective anode and the second semi-reflecting semi-transparent layer is selected to form a second micro-cavity which enhances green light emission from the organic light emitting device.

2. The organic light emitting device as claimed in claim 1 in which the reflective anode is carried by a substrate, and the white light is emitted out of the organic light emitting device through the cathode structure.

3. The organic light emitting device as claimed in claim 1 in which the first distance between the reflective anode and the first semi-reflecting semi-transparent layer is in a range 330 to 370 nm.

4. The organic light emitting device as claimed in claim 3 in which the first distance between the reflective anode and the first semi-reflecting semi-transparent layer is between 345 and 355 nm.

5. The organic light emitting device as claimed in claim 3 in which a refractive index of the first light emitting layer is in a range 1.55 to 1.67.

6. The organic light emitting device as claimed in claim 5 in which a refractive index of the second light emitting layer is in a range 1.55 to 1.67.

7. The organic light emitting device as claimed in claim 2 in which the first distance between the reflective anode and the first semi-reflecting semi-transparent layer is in a range 330 to 370 nm.

* * * * *